(12) United States Patent
Sharma et al.

(10) Patent No.: US 7,079,148 B2
(45) Date of Patent: Jul. 18, 2006

(54) NON-VOLATILE MEMORY PARALLEL PROCESSOR

(75) Inventors: Manish Sharma, Sunnyvale, CA (US); Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/625,016

(22) Filed: Jul. 23, 2003

(65) Prior Publication Data

US 2005/0017979 A1 Jan. 27, 2005

(51) Int. Cl.
G06F 15/76 (2006.01)
G06F 15/80 (2006.01)
G06F 15/167 (2006.01)

(52) U.S. Cl. .................. 345/519; 345/505; 345/541

(58) Field of Classification Search ............. 345/505, 345/502, 501, 530, 536; 711/1, 5, 100–105; 365/50, 55, 66, 52

See application file for complete search history.

(56) References Cited

U.S. PATENT DOCUMENTS

| 5,621,683 | A * | 4/1997 | Young .................. 365/185.05 |
| 5,754,484 | A * | 5/1998 | Perreault ................... 365/200 |
| 6,498,739 | B1 * | 12/2002 | Cloud et al. ................ 365/51 |
| 6,552,745 | B1 | 4/2003 | Perner |
| 6,611,241 | B1 * | 8/2003 | Firester et al. .............. 345/1.3 |
| 6,713,810 | B1 * | 3/2004 | Bhattacharyya ............ 257/315 |
| 2001/0023992 | A1 * | 9/2001 | Doll ........................... 257/777 |
| 2002/0073413 | A1 * | 6/2002 | Goodman ................... 717/172 |
| 2002/0087886 | A1 * | 7/2002 | Ellis ........................... 713/201 |
| 2004/0192383 | A1 * | 9/2004 | Zacks et al. ................ 455/557 |
| 2004/0196290 | A1 * | 10/2004 | Satoh ......................... 345/505 |

OTHER PUBLICATIONS

R Desikan, C.R. Lefurgy, S.W. Keckler, D. Burger: "Tech Report TR-02-47: On-chip MRAM as a high-bandwidth, low-latency replacement for DRAM physical memories" XP002303537.
Aizawa K et al: On sensor image compression forhigh pixel rate imaging: Sep. 16, 196; XP010202832.
Jaehyuk Huh et al: "Exploring the Design Space of Future CMPS" Sep. 8, 2001; XP010558960.
Sikora A: "Die Zukunft des Speichers Feram, Mram und Andere Speichertechnologien auf der Suche Nach dem Heiligen Gral-Teil2";Mar. 19, 2002; XP001162640.
WO 03/23913 A (Brown University Res Found ; Nurmikko Arto V (US); Mar. 20, 2003; Abstract.

* cited by examiner

Primary Examiner—Kee M. Tung (57) ABSTRACT

The invention includes a parallel processor. The parallel processor includes a plurality of non-volatile memory cells. The parallel processor additionally includes a plurality of processor elements. At least one non-volatile memory cell corresponds with each of the processor elements. The processor elements each access data from at least one corresponding non-volatile memory cell. The processor elements perform processing on the data. The non-volatile memory cells can include magnetic memory cells.

28 Claims, 13 Drawing Sheets

NON-VOLATILE MEMORY PARALLEL PROCESSOR

FIELD OF THE INVENTION

The invention relates generally to electronic memory. More particularly, the invention relates to a non-volatile memory parallel processor.

BACKGROUND OF THE INVENTION

Computer systems are becoming increasingly sophisticated allowing users to perform a continually increasing variety of computing tasks at faster rates. As a result, complex computations are required to be performed by the computer systems at greater rates.

Parallel processing is a method in which multiple operations or computations are performed in parallel. That is, instead of performing the operations serially, the operations are performed simultaneously. The results of the simultaneous operations can be combined after being individually completed. The net result is that total computations can be performed at greater speeds.

Parallel processing can be particularly useful for applications that receive or generate a large number of inputs or outputs, and provide processing of the inputs and outputs. For example, the reception or generation of images can benefit from parallel processing. Image processing can include operations being performed on many image elements (for example, pixels).

Presently, parallel processing computing systems are typically volatile. That is, generally the parallel processing computing systems fail if power to the computing systems is turned off. In some applications, this reduces the efficiency of the computing system. It can be advantageous to be able to maintain the parallel processing data during a power shut down, so that the processing can be easily restarted.

It is desirable to have a method of parallel processing that is non-volatile. It is desirable that the parallel processing be adaptable for image processing. Additionally, it is desirable that the parallel processing systems be easily integratable.

SUMMARY OF THE INVENTION

The invention includes an apparatus and method of parallel processing. The apparatus and method are adaptable for image processing. Additionally, the parallel processing apparatus can be efficiently integrated.

An embodiment of the invention includes a parallel processor. The parallel processor includes a plurality of non-volatile memory cells. The parallel processor additionally includes a plurality of processor elements. At least one non-volatile memory cell corresponds with each of the processor elements. The processor elements each access data from at least one corresponding non-volatile memory cell. The processor elements perform processing on the data. The non-volatile memory cells can include magnetic memory.

Other aspects and advantages of the present invention will become apparent from the following detailed description, taken in conjunction with the accompanying drawings, illustrating by way of example the principles of the invention.

DETAILED DESCRIPTION

As shown in the drawings for purposes of illustration, the invention is embodied in an apparatus and method of parallel processing data stored in MRAM elements with multiple processor elements. The parallel processing apparatus can be efficiently integrated.

Figure 1:
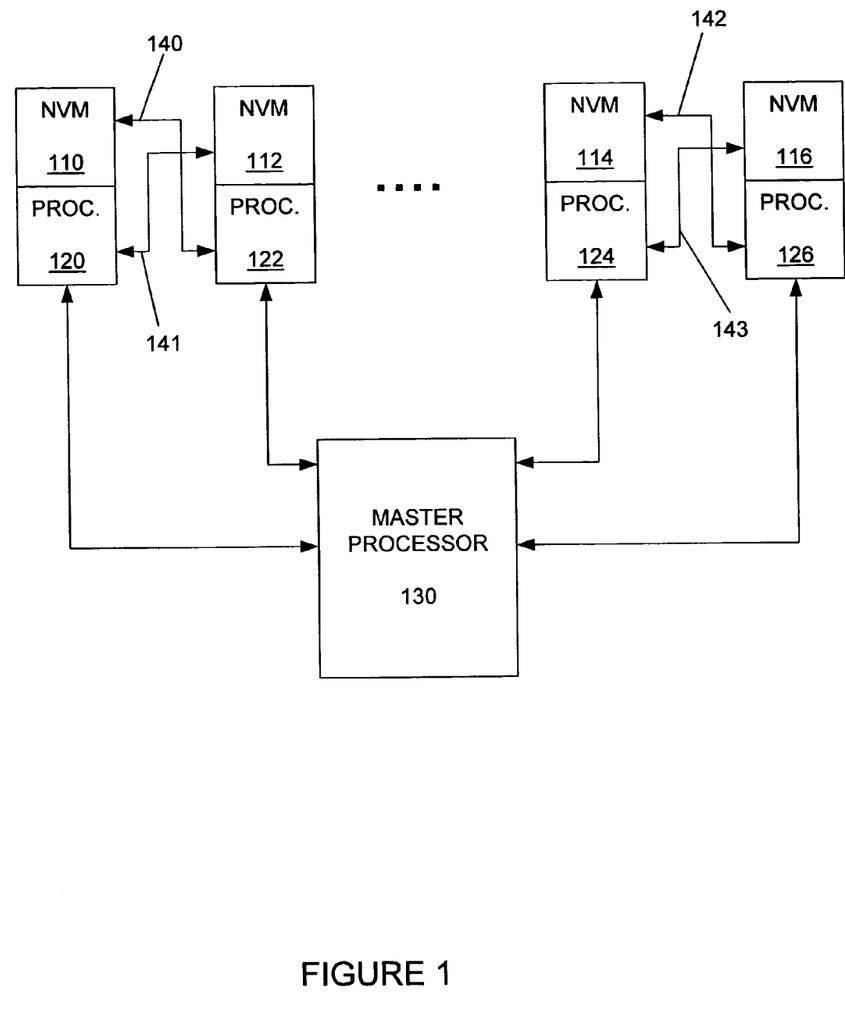
FIG. 1 shows an embodiment of the invention.

FIG. 1 shows an embodiment of the invention. More specifically, the embodiment of FIG. 1 includes a parallel processor. The parallel processor includes a plurality of non-volatile memory cells 110, 112, 114, 116. Additionally, the parallel processor includes a plurality of processor elements 120, 122, 124, 126. As shown in FIG. 1, at least one non-volatile memory cell 110, 112, 114, 116 corresponds with each of the processor elements 120, 122, 124, 126. The processor elements 120, 122, 124, 126 can each access data from an at least one corresponding non-volatile memory cell 110, 112, 114, 116. The processor elements 120, 122, 124, 126 can process data that has been stored in the non-volatile memory cell 110, 112, 114, 116.

Control and data lines 140, 141, 142, 143 are included within FIG. 1 to depict that in some embodiments, the processor elements 120, 122, 124, 126 can access data from more non-volatile memory cells 110, 112, 114, 116 than just the corresponding non-volatile memory cell 110, 112, 114, 116.

The data stored in the non-volatile memory cell 110, 112, 114, 116 is retained when power to the parallel processor is turned off. Therefore, a system implementing the parallel processor of FIG. 1 can quickly recover after power is restored. Additionally, some types of non-volatile memory, such as magnetic memory, can provide quick access times, which can improve system performance.

As will be described, the non-volatile memory cells 110, 112, 114, 116 can be integrated with the processor elements 120, 122, 124, 126. As will be described, the non-volatile memory cells 110, 112, 114, 116 can be magnetic memory cells. An embodiment includes each magnetic memory cell 110, 112, 114, 116 being formed adjacent to a substrate, and the corresponding processor 120, 122, 124, 126 element being formed in the substrate adjacent to the magnetic memory cell.

As will be described, an embodiment includes each non-volatile memory cell being interfaced with a corresponding at least one dynamic random access memory (DRAM) cell. This embodiment can provide performance advantages because non-volatile memory and DRAM each provide performance advantages. By combining the two types of memory, the advantages provides by each can be utilized.

The embodiment of FIG. 1 includes a master processor 130. The master processor can combine processed data from each of the processor elements 120, 122, 124, 126. The configuration can provide advantages over a single processor configuration because each of the processor elements 120, 122, 124, 126 can process data in parallel. Another configuration does not include the master processor 130, but rather, includes at least one of the processor elements 120, 122, 124, 126 providing the functionality of the master processor. Additionally, the processor elements 120, 122, 124, 126 providing the master processor functionality can change over time.

Figure 2:
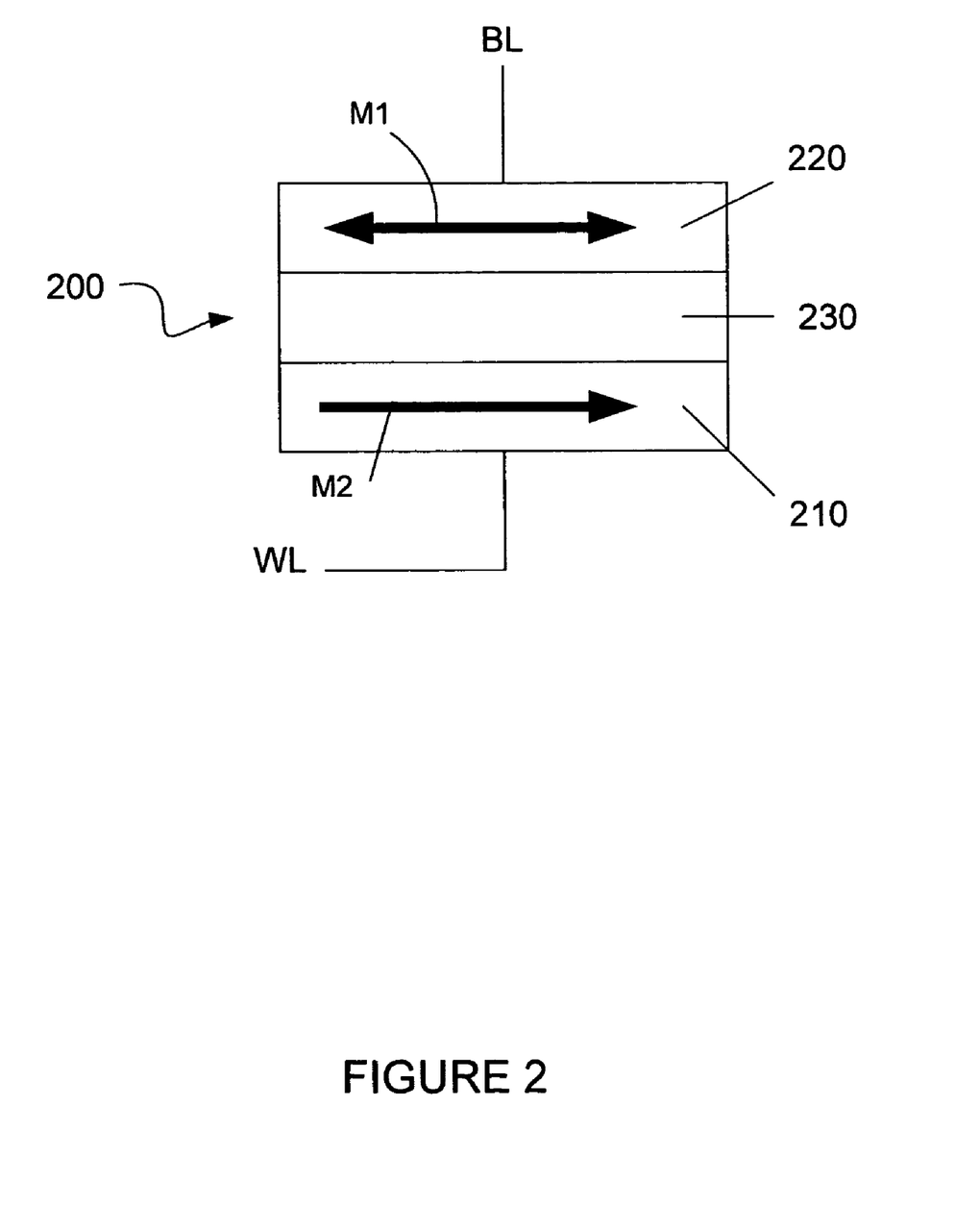
FIG. 2 shows a magnetic memory cell according to an embodiment of the invention.

FIG. 2 shows a magnetic memory cell (MRAM) 200 according to an embodiment of the invention. The MRAM memory cell 200 includes a sense layer 220, a dielectric region 230 and a reference layer 210. The orientation of magnetization within the sense layer 220 is non-fixed, and can assume two stable orientations as shown by the arrow M1. The reference layer 210 (also referred to as a pinned magnetic region) has a fixed magnetic orientation as depicted by the arrow M2. The dielectric region 230 generally provides electrical insulation between the sense layer 220 and the reference layer 210.

As previously stated, the orientation of magnetization of the sense layer 220 can assume two stable orientations. These two orientations, which are either parallel or anti-parallel to the magnetic orientation of the reference layer 210, determine the logical state of the MRAM memory cell 200.

The magnetic orientation of the MRAM memory cell 200 is set (written to) by controlling electrical currents flowing through the word lines and the bit lines, and therefore, by the corresponding magnetic fields induced by the electrical currents. Because the word line and the bit line operate in combination to switch the orientation of magnetization of the selected memory cell (that is, to write to the memory cell), the word line and the bit line can be collectively referred to as write lines. Additionally, the write lines can also be used to read the logic value stored in the memory cells.

The orientation of magnetization of the sense layer 220 is determined in response to electrical currents applied to the bit lines (BL) and the word lines (WL) during a write operation to the MRAM memory cell. The electrical currents applied to the bit line and the word line set the orientation of the magnetization of the sense layer depending upon the directions of the currents flowing through the bit line and the word line, and therefore, the directions of the induced magnetic fields created by the currents flowing through the bit line and the word line.

The MRAM memory cell 200 is read by sensing a resistance across the MRAM memory cells. The resistance is sensed through the word lines and the bit lines.

The reference layer 210 and the sense layer 220 can be made of a ferromagnetic material.

If the magnetization of the sense layer 220 and the reference layer 210 of the MTJ memory cell are in the same direction, the orientation of the MTJ memory cell can be referred to as being "parallel." If the magnetization of the sense layer 220 and the reference layer 210 of the MTJ memory cell are in opposite directions, the orientation of the MTJ memory cell can be referred to as being "anti-parallel." The two orientations, parallel and anti-parallel, can correspond to MTJ memory cell states of low or high resistance respectively.

The dielectric regions 230 allow quantum mechanical tunneling to occur between the reference layer 210 and the sense layer 220. The tunneling is electron spin dependent, causing the resistance of the MTJ memory cell to be a function of the relative orientations of the magnetization directions of the reference layer 210 and the sense layer 220. The resistance state of the MJT memory cell can be sensed to determine the magnetization orientations of the reference layer 210 and the sense layer 220.

The resistance of the MTJ memory cell is a first value (R) if the magnetization orientation of the MTJ memory cell is parallel and a second value (R+delta) if the magnetization orientation is anti-parallel. The invention, however, is not limited to the magnetization orientation of the two layers, or to just two layers.

The dielectric region 230 can be made of aluminum oxide, silicon dioxide, tantalum oxide, silicon nitride, aluminum nitride, or magnesium oxide. However, other dielectrics and certain semiconductor materials may also be used for the dielectric region 230. The thickness of the dielectric region 230 may range from about 0.5 nanometers to about three nanometers. However, the invention is not limited to this range.

The sense layer 220 may be made of a ferromagnetic material. The reference layer 210 can be implemented as a synthetic ferrimagnet (SF), also referred to as an artificial antiferromagnet.

The non-volatile memory cell can include other types of memory including ferro-electric FeRAM and Flash memory. These other non-volatile types of memory are well known in the art of digital electronics.

Figure 3:
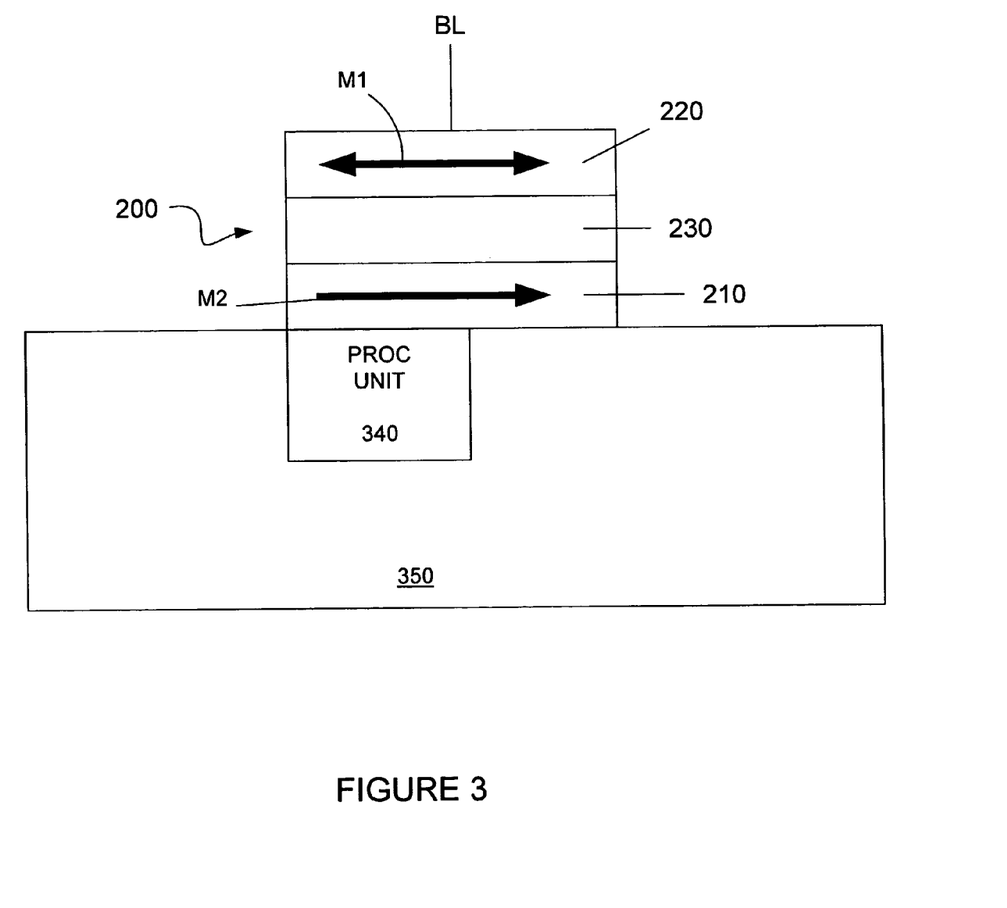
FIG. 3 shows an MRAM cell and processor element according to an embodiment of the invention.

FIG. 3 shows an MRAM cell 200 and processor element 340 according to an embodiment of the invention. The MRAM cell 200 as shown in FIG. 3 is formed over a substrate 350. The substrate 350 can include a corresponding processor element 340.

As will be described, the structure shown in FIG. 3 is desirable because the MRAM cell 200 does not include any transistor elements. Therefore, the MRAM cell can be formed during the conductor processing of an integrated circuit. That is, semiconductors within the substrate 350 typically include conductive lines formed over the substrate 350. The MRAM cell provides the advantage of being formed during the formation of the conductive lines. This provides ease of producing, and allows the MRAM cell 200 to be formed proximate to the corresponding processor element 340.

Structurally, an array of MRAM cells can be formed over an array of processor elements. Physically, each MRAM cell can be formed over the corresponding processor element. This provides a space efficient implementation of the memory array and the parallel processor.

Figure 4:
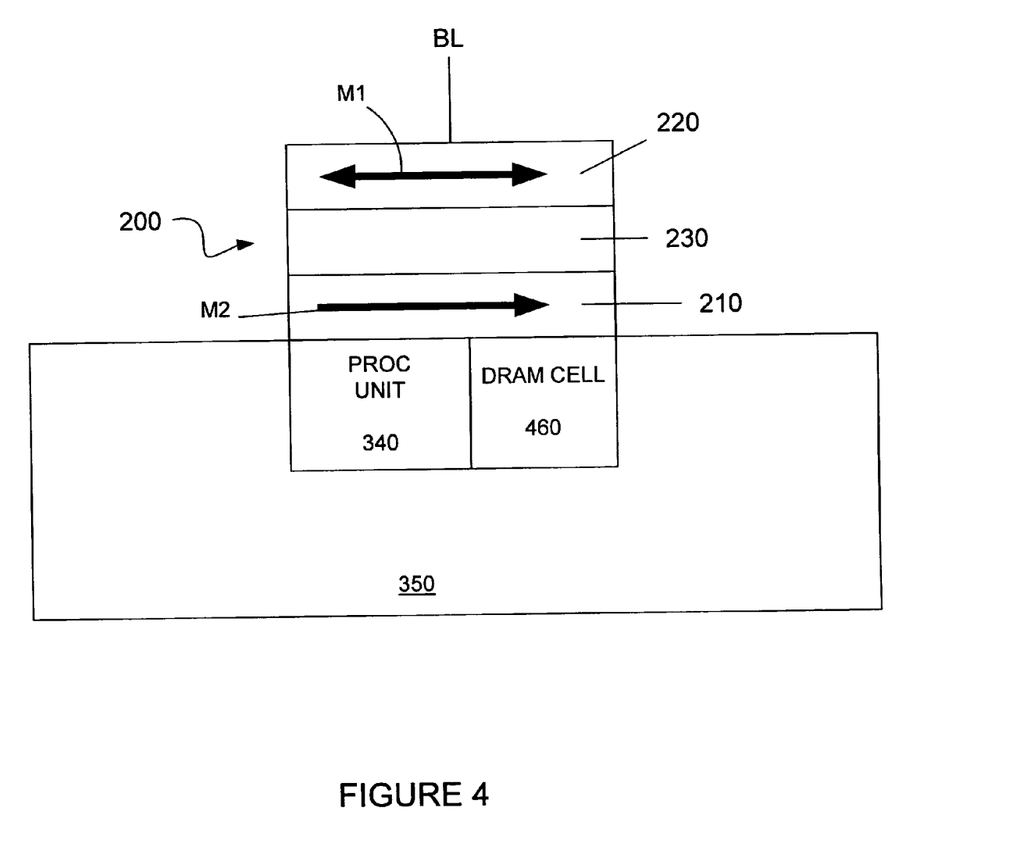
FIG. 4 shows an MRAM cell, processor element and DRAM cell according to an embodiment of the invention.

FIG. 4 shows an MRAM cell 200, processor element 340 and DRAM cell 460 according to an embodiment of the invention. The MRAM cell 200 as shown in FIG. 3 is formed over a substrate 350 and the DRAM cell 460.

The MRAM/DRAM memory cells structure of FIG. 4 allows both the DRAM cell 460 and the MRAM cell 200 to be written to and read from at the same time. A single word line WL can be connected to both the MRAM cell 200 and the DRAM cell 460.

The shared MRAM/DRAM memory cells provide for the integration of MRAM and DRAM memory cells on a common substrate. As will be shown later, the integrated memory cell allows for the formation of integrated memory cell arrays in which large amounts of data can be easily transferred from MRAM cells to DRAM cells, and/or from DRAM cells to MRAM cells.

Figure 5:
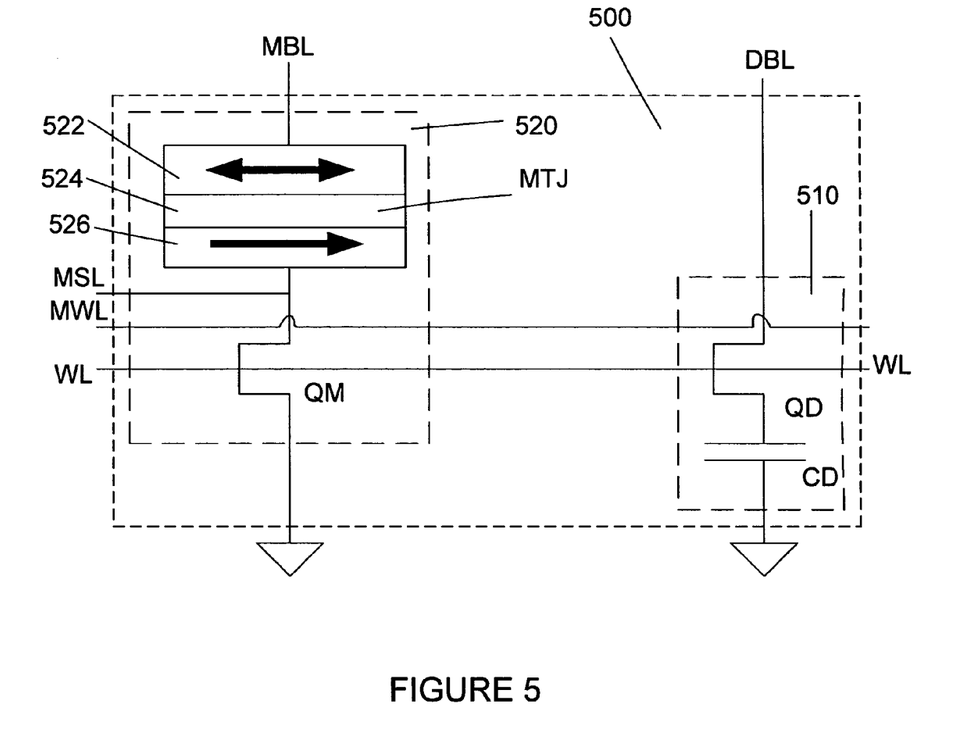
FIG. 5 shows a circuit schematic of an integrated MRAM cell and DRAM cell according to an embodiment of the invention.

FIG. 5 shows a circuit schematic of an integrated MRAM cell and DRAM cell according to an embodiment of the invention. This embodiment includes a shared DRAM/MRAM memory cell 500 that includes a first memory cell 510, and a non-volatile memory cell 520 that is interfaced to the first memory cell 510.

The first memory cell 510 can include a DRAM memory cell. The DRAM memory cell shown in FIG. 5 includes a DRAM controlling transistor QD and a storage capacitor CD. Charge is both stored on the storage capacitor CD, and sensed from the storage capacitor CD through a word line WL and a bit line DBL.

The non-volatile memory cell 520 can include an MRAM memory cell. The MRAM memory cell shown in FIG. 5 includes an MRAM controlling transistor QM and a magnetoresistive tunnel junction (MTJ) memory cell. Magnetic states of the MRAM memory cell 520 are set by magnetic fields generated by current flowing through bit line MBL and write word line MWL. The magnetic state of the MRAM cell 520 is sensed, by sensing a resistance of the MTJ memory cell through a sense line MSL and a bit line MBL. As previously described, the magnetic orientation of the MTJ memory cell determines the resistance across the MTJ memory cell.

Figure 6:
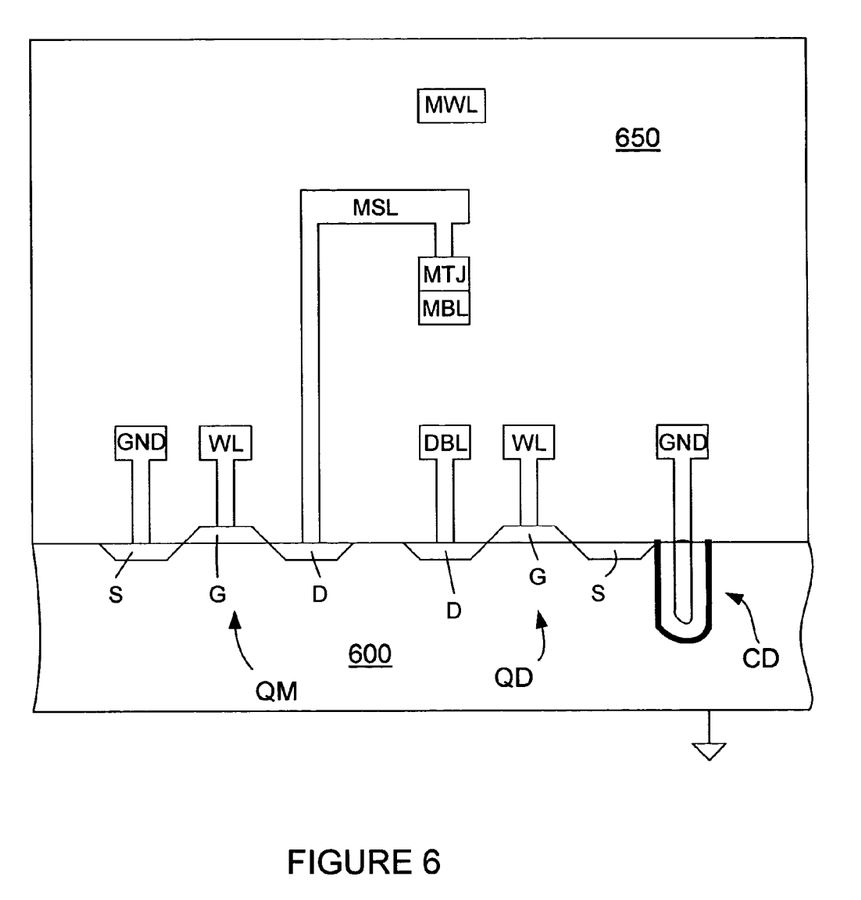
FIG. 6 shows a structure of an integrated MRAM cell and DRAM cell according to an embodiment of the invention.

FIG. 6 shows a shared MRAM/DRAM memory cell according to an embodiment of the invention. FIG. 6 is an embodiment of a physical implementation of the MRAM/DRAM memory cells of FIG. 4 and FIG. 5.

This embodiment can be fabricated on a substrate 600 of silicon. Diffusion regions in the substrate 600 can be used to form the drain (D) and source (S) of the MRAM controlling transistor QM and the DRAM controlling transistor QD.

A trench formed in the substrate 600 can be filled with conductive material and dielectric material to form the DRAM capacitor CD.

A first metallization layer can be used to form conductive contacts to the source (S) of the MRAM controlling transistor, the gate (G) of the MRAM controlling transistor, the drain (D) of the DRAM controlling transistor, the gate (G) of the DRAM controlling transistor and the DRAM capacitor. The source of the MRAM controlling transistor can be connected to ground (GND). The gate (G) of the MRAM controlling transistor can be connected to the word line (WL). The drain (D) of the DRAM controlling transistor can be connected to the DRAM bit line DBL. The source (S) of the DRAM controlling transistor is connected to a first terminal of the DRAM capacitor CD. This connection can be formed by forming the source (S) of the DRAM controlling transistor so close to the first terminal of the DRAM capacitor CD that source (S) and the first terminal are electrically connected. A second terminal of the DRAM capacitor CD can be connected to ground (GND).

A second metallization layer can be used to form a conductive contact to the magnetic tunnel junction (MTJ) memory cell of the MRAM memory cell. The conductive contact can be connected to the MRAM bit line MBL.

A third metallization layer can also be used to form a conductive contact to the magnetic tunnel junction device of the MRAM memory cell. The conductive contact can be connected to the MRAM sense line MSL.

A fourth metallization layer can be used to form the MRAM write word line MWL.

The metallization layers can be formed from Tantalum, Copper or Aluminum.

Figure 7:
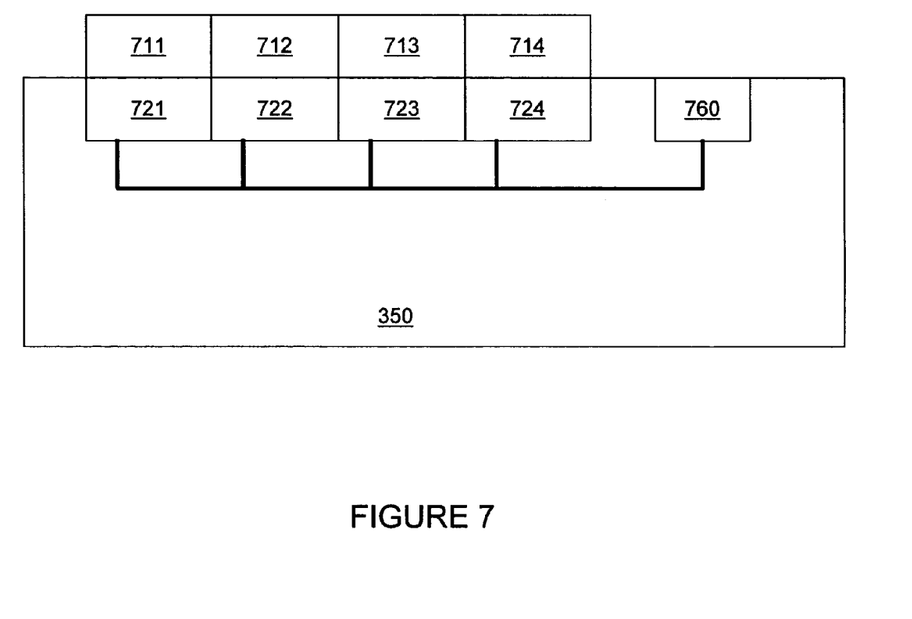
FIG. 7 shows multiple MRAM cells, multiple processor elements, multiple DRAM cells, and a master processor according to another embodiment of the invention.

FIG. 7 shows multiple MRAM cells 711–714, multiple processor elements 721–724, and a master processor 760 according to another embodiment of the invention. As shown in FIG. 7, the multiple processor elements 721–724 are connected to the master processor 760.

The master processor 760 can receive processed data from each of the processor elements. The master processor 760 can then combine the processed data from each of the processor elements, and provide additional processing of the combined data if required.

Figure 8:
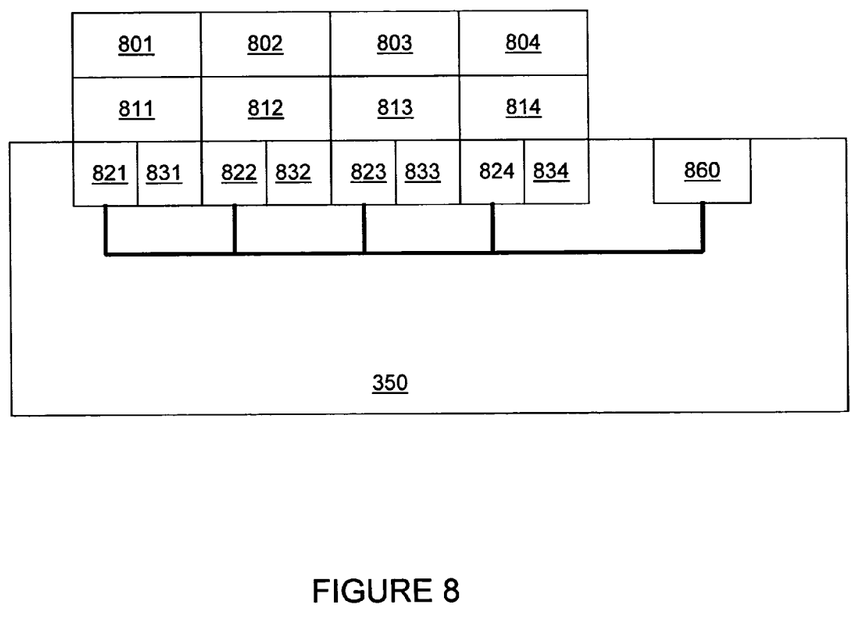
FIG. 8 shows an array of image sensors, multiple MRAM cells, multiple DRAM cells, multiple processor elements, and a master processor according to another embodiment of the invention.

FIG. 8 shows an array of image sensors 801–804, multiple MRAM cells 811–814, multiple DRAM cells 831–834, multiple processor elements 821–824, and a master processor 860 according to another embodiment of the invention.

The image sensors 801–804 can include amorphous silicon diodes, thin film photo sensors, and active pixel sensors. The image sensors can be fabricated over the MRAM cells. The image sensors are electrically connected to the MRAM cells.

Each image sensor receives an image, and generates a voltage that is proportional to the intensity of the received image. A local processor element creates a digital representation of the generated voltage is stored in a corresponding MRAM cell.

Each of the processor elements 821–824 can perform image processing of the image received by the image sensors 801–804. The processing can be performed in parallel, and then summed at the master processor 860. The DRAM cells 831–834 can be used to optimize processing.

Figure 8A:
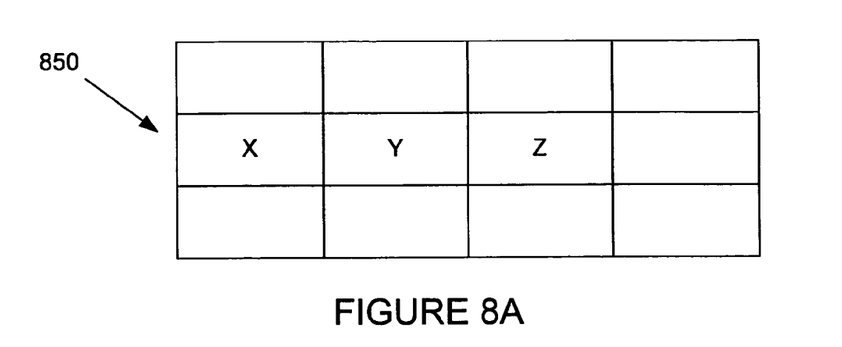
FIGS. 8A, 8B and 8C shows an array of image sensors, DRAM cells and processor elements in greater detail.
Figures 8B, 8C:
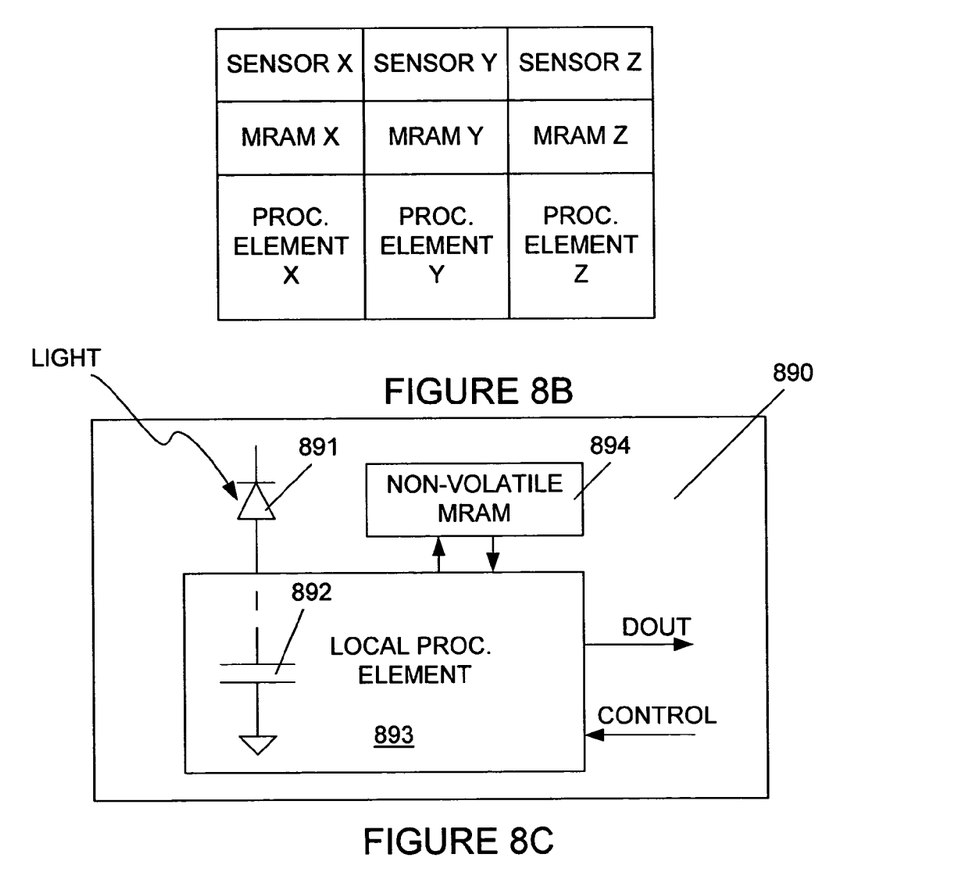

FIGS. 8A, 8B and 8C shows an array of image sensors, DRAM cells and processor elements in greater detail.

FIG. 8A shows a top-view of an array of neighboring sensor pixels X, Y, Z within an array of sensor pixels 850.

FIG. 8B shows a cross-section of neighboring sensors pixels X, Y and Z, corresponding MRAM cells X, Y and Z and corresponding local processing elements X, Y and Z. The sensor pixels can be a thin film sensor array. The MRAM cells can be a part of an MRAM array. The sensor pixels can receive light as indicated in FIG. 8C.

FIG. 8C shows a block diagram of an individual sensor pixel including the sensor (which can include a light sensitive diode 891 and a sense capacitor 892), a local processing element 893 and a non-volatile MRAM cell 894. The local processing element 893 and the non-volatile MRAM cell can include a two-way interface. The local processing element 893 can include an interface to a master processor that includes data (DOUT) and controls (CONTROL).

Figure 9:
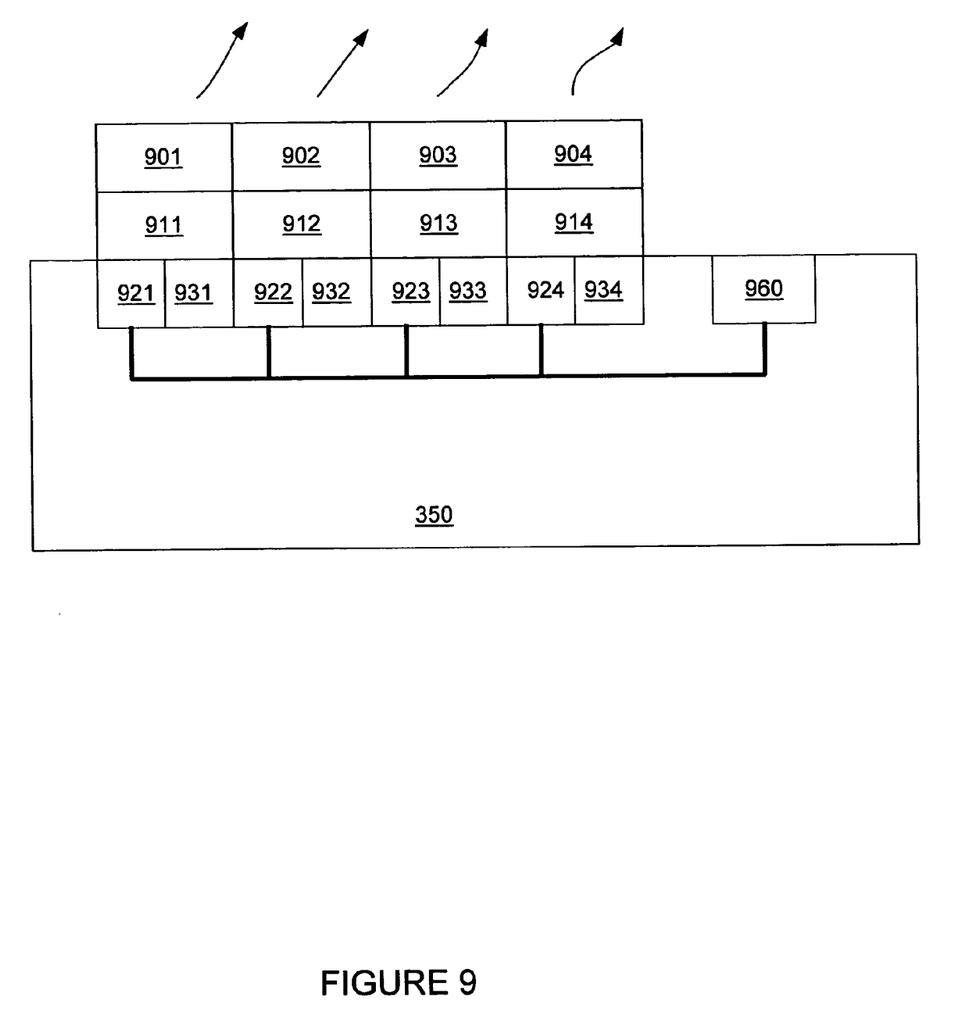
FIG. 9 shows an array of light emitters, multiple MRAM cells, multiple DRAM cells, multiple processor elements, and a master processor according to another embodiment of the invention.

FIG. 9 shows an array of light emitters 901–904, multiple MRAM cells 911–914, multiple DRAM cells 931–934, multiple processor elements 921–924, and a master processor 960 according to another embodiment of the invention.

As will be described, the MRAM cells can be used to store a value that adjustably sets the intensity of light emitted from each of the light emitters.

As previously described, the processor elements 921–924 can perform image processing in parallel providing more efficient processing than a non-parallel processing system.

Figure 10:
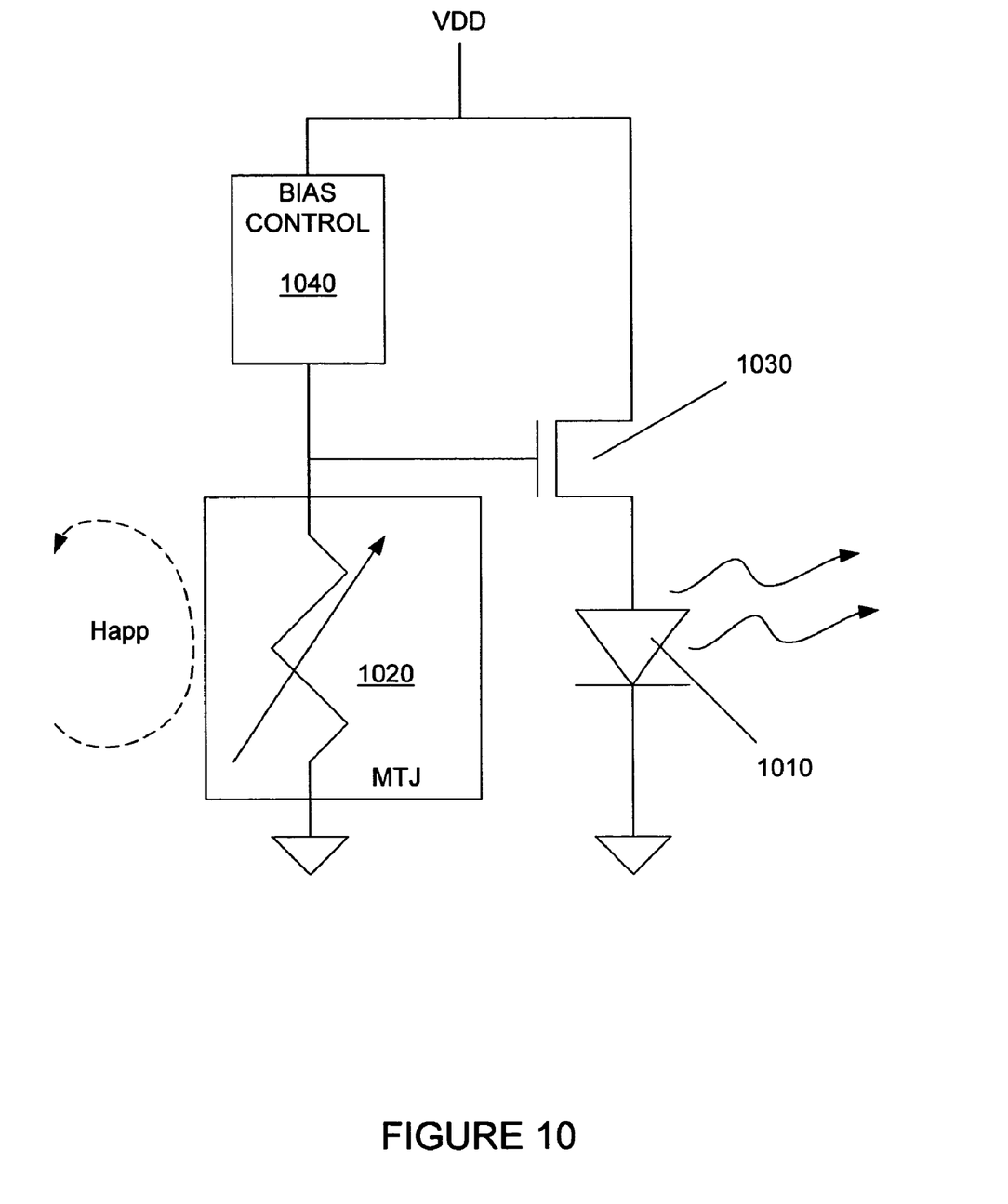
FIG. 10 shows a circuit schematic of an MRAM and a light emitter according to an embodiment of the invention.

FIG. 10 shows a circuit schematic of an MRAM and a light emitter according to an embodiment of the invention. This embodiment includes a light emitting diode (LED) 1010 that emits light. The amount of light emitted from the LED 1010 can be dependent upon a bias current flowing through the LED 1010.

The intensity of the light emitted by the LED 1010 can be controlled by a resistance of a magnetic tunnel junction 1020. As previously described, the resistance of the tunnel magnetic junction 1020 is dependent upon the state of the tunnel magnetic junction 1020. Therefore, the states of the magnetic tunnel junction 1020 control the intensity of the light emitted from the LED 1010. The states of the tunnel magnetic junction 1020 are determined by the application of a magnetic field Happ.

The embodiment shown in FIG. 10 further includes a bias transistor 1030 and a bias controller 1040. The bias controller 1040 can be configured so that the bias current flowing through the LED 1010 is dependent upon the resistance of the tunnel magnetic junction 1020, and therefore, the state of the tunnel magnetic junction 1020.

The embodiment of FIG. 10 is merely an example of circuit in which the intensity of a light source is modulated based upon the state of a magnetic tunnel junction. Many other possible circuits that provide for modulation of a light source depending upon the resistance of a magnetic tunnel junction are possible.

An alternate embodiment includes the light emitting source being a laser diode such as a vertical cavity surface emitting laser (VCSEL). The invention can also use other modulated light sources.

Figure 11:
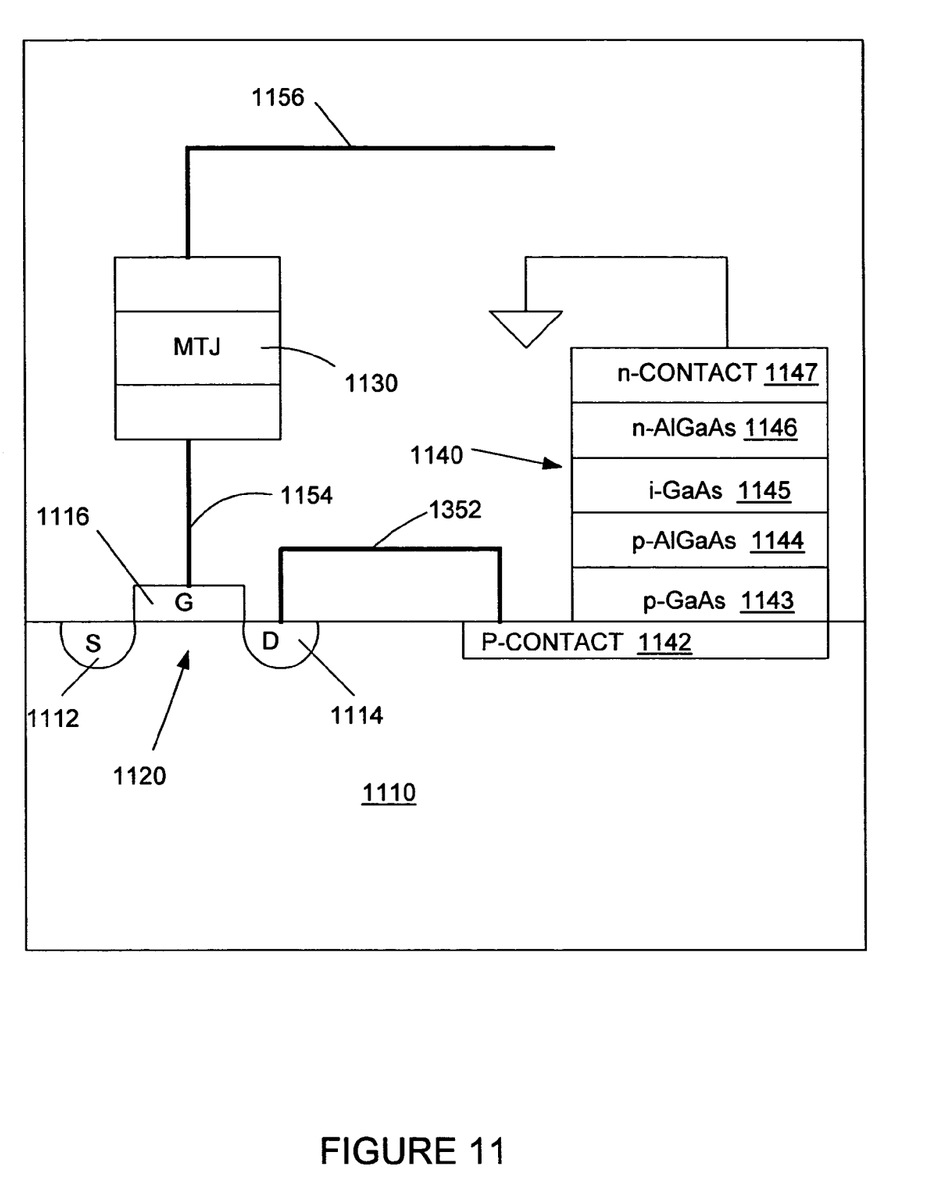
FIG. 11 shows a substrate including an MRAM structure and light emitter according to an embodiment of the invention.

FIG. 11 shows a substrate including an MRAM structure and light emitter according to an embodiment of the invention. The substrate includes a controlling transistor 1120, a magnetic tunnel junction 1130 and a controllable light emitting device 1140.

The controlling transistor 1120, the magnetic tunnel junction 1130 and the controllable light emitting device 1140 can be electrically connected through conductive lines 1152, 1154, 1156.

The controlling transistor 1120 can be formed in the substrate 1110, and include a source 1112, a drain 1114 and a poly-Si gate 1116. The magnetic tunnel junction 1130 can be formed over the controlling transistor 1120. The controlling transistor 1120 can be electrically connected to a light emitting device 1140.

Standard semiconductor processing steps can be used to form the controlling transistor 1120.

The light emitting device 1140 can include a PIN diode that includes a p-contact 1142, a p-GaAs layer 1143, a p-AlGaAs layer 1144, an i-GaAs layer 1145 an n-AlGaAs layer 1446 and an n-contact 1147.

Standard semiconductor processing steps can be used to form the light emitting device 1140.

Standard semiconductor processing steps can be used to form the conductive lines 1152, 1154, 1156. Similar semiconductor processing steps can be used to form the conductive layers of the MTJ 1130.

The embodiment of FIG. 11 provides an integrated MTJ 1130 and light emitting device 1140 that can provide selective comb filtering. As previously described, the filtering is dependent upon the materials and physical characteristics of the MTJ 1130.

Figure 12:
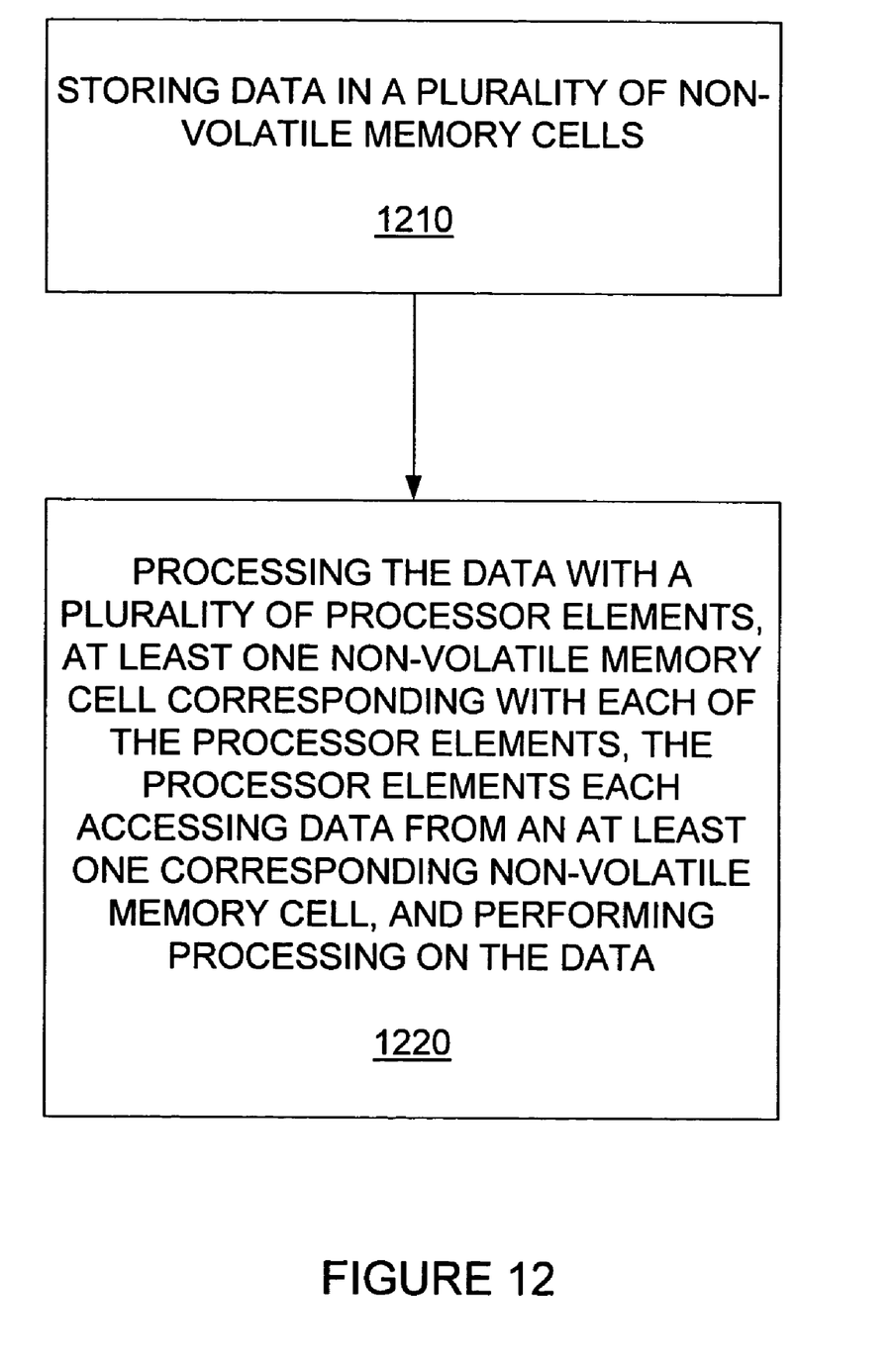
FIG. 12 is a flow chart that includes acts according to an embodiment of the invention.

FIG. 12 is a flow chart that includes acts according to an embodiment of the invention. The acts provide a method of parallel processing.

A first act 1210 includes storing data in a plurality of non-volatile memory cells.

A second act 1220 includes processing the data with a plurality of processor elements, at least one non-volatile memory cell corresponding with each of the processor elements, the processor elements each accessing data from an at least one corresponding non-volatile memory cell, and performing processing on the data.

Although specific embodiments of the invention have been described and illustrated, the invention is not to be limited to the specific forms or arrangements of parts so described and illustrated. The invention is limited only by the appended claims.

What is claimed:

1. A parallel processor comprising:
a plurality of shared memory cells, each shared memory cell comprising a magnetic memory cell integrated with a DRAM cell, wherein a word line (WL) is connected to the magnetic memory cell and the DRAM cell;
a plurality of processor elements, each processor element being integrated with a shared memory cell, each processor elements accessing data from a corresponding shared memory cell that is integrated with the processor element, and performing processing on the data.

2. The parallel processor of claim 1, wherein the non-volatile memory cells comprise magnetic memory cells.

3. The parallel processor of claim 2, wherein each magnetic memory cell is formed adjacent to a substrate, and the corresponding processor element is formed in the substrate proximate and adjacent to the magnetic memory cell.

4. The parallel processor of claim 3, wherein the corresponding processor element is formed in the substrate most proximate to the magnetic memory cell.

5. The parallel processor of claim 1, wherein each processor element can access a plurality of magnetic memory cells.

6. The parallel processor of claim 1, wherein each magnetic memory cell is interfaced with a corresponding one dynamic random access memory (DRAM) cell.

7. The parallel processor of claim 1, wherein each magnetic memory cell is formed adjacent to a substrate, and the corresponding processor element and DRAM cell are formed in the substrate proximate and adjacent to the magnetic memory cell.

8. The parallel processor of claim 7, wherein the corresponding processor element and DRAM cell are formed in the substrate most proximate to the magnetic memory cell.

9. The parallel processor of claim 1, further comprising:
a master processor for receiving processed data from the plurality of processor elements.

10. The parallel processor of claim 9, wherein the master processor performs additional processing of the data.

11. The parallel processor of claim 1, further comprising:
an array of image sensors, an image sensor corresponding with each of the magnetic memory cells.

12. The parallel processor of claim 11, wherein each image sensor receives image data that can be stored in the corresponding magnetic memory cell.

13. The parallel processor of claim 12, wherein each processing element performs processing on the image data stored in a corresponding magnetic memory cell.

14. The parallel processor of claim 12, wherein the received image data is additionally stored in at least one DRAM cell integrated with the magnetic memory cell.

15. The parallel processor of claim 14, wherein each image sensor is formed adjacent to a corresponding magnetic memory cell, and each magnetic memory cell is formed adjacent to a substrate, the substrate comprising a corresponding processor element and DRAM cell formed adjacent to the magnetic memory cell.

16. The parallel processor of claim 11, wherein each image sensor is formed adjacent to a corresponding magnetic memory cell, and each non-volatile memory element is formed adjacent to a substrate, the substrate comprising a corresponding processor element formed adjacent to the magnetic memory cell.

17. The parallel processor of claim 11, wherein the image sensor corresponding with a magnetic memory cell is the image sensor most proximate to the magnetic memory cell.

18. The parallel processor of claim 1, further comprising: an array of display pixels, each display pixel integrated with a magnetic memory cell.

19. The parallel processor of claim 18, wherein each display pixel displays image data that is stored in the integrated magnetic memory cell.

20. The parallel processor of claim 18, wherein each processing element performs processing on the image data stored in the magnetic memory cell.

21. The parallel processor of claim 18, wherein the received image data is additionally stored in one DRAM cell integrated with the magnetic memory cell.

22. The parallel processor of claim 21, wherein each display pixel is formed adjacent to a corresponding magnetic memory element, and each magnetic memory element is formed adjacent to a substrate, the substrate comprising a corresponding processor element and DRAM cell formed adjacent to the magnetic memory element.

23. The parallel processor of claim 18, wherein a display pixel receives image data from a magnetic memory cell, and wherein the display pixel is an LED and a bias current of the LED is dependent upon a resistance of the magnetic memory cell.

24. The parallel processor of claim 18, wherein each display pixel is formed adjacent to a corresponding non-volatile memory element, and each non-volatile memory element is formed adjacent to a substrate, the substrate comprising a corresponding processor element formed adjacent to the non-volatile memory element.

25. The parallel processor of claim 18, wherein the display pixel corresponding with a non-volatile memory cell is the display pixel most proximate to that is integrated with the non-volatile memory cell.

26. The parallel processor of claim 1, wherein the word line (WL) is connected a MRAM controlling transistor of the non-volatile memory and to a DRAM controlling transistor of the dynamic random access memory (DRAM) cell, and wherein a first metallization layer forms conductive contacts to an MRAM gate of the MRAM controlling transistor, a DRAM gate of the DRAM controlling transistor and to a DRAM capacitor, a second metallization layer forms a conductive contact to the non-volatile memory, a third metallization layer forms another conductive contact to the non-volatile memory, and a fourth metallization layer forms a non-volatile memory write word line.

27. A method of parallel processing, comprising:
storing data in a plurality of magnetic memory cells;
processing the data with a plurality of processor elements which are integrated with the magnetic memory cells and DRAM cells, each processor element accessing data from the integrated magnetic memory cell and integrated DRAM cell by selecting a word line (WL) connected to the magnetic memory cell and the DRAM cell, and performing processing on the data.

28. A computing system comprising:
a central processing unit;
a parallel processor connected to the central processing unit, the parallel processor comprising:
a plurality of processor elements, each processor element being integrated with a magnetic memory cell, each processor elements accessing data from the magnetic memory cell and an integrated DRAM cells, wherein a word line (WL) is connected to the magnetic memory cell and the DRAM cell.

* * * * *